United States Patent
Tayrani et al.

(10) Patent No.: US 6,949,978 B2
(45) Date of Patent: Sep. 27, 2005

(54) EFFICIENT BROADBAND SWITCHING-MODE AMPLIFIER

(75) Inventors: Reza Tayrani, Marina Del Rey, CA (US); Clifford W. Meyers, Rancho Palos Verdes, CA (US)

(73) Assignee: Raytheon Company, Waltham, MA (US)

(*) Notice: Subject to any disclaimer, the term of this patent is extended or adjusted under 35 U.S.C. 154(b) by 28 days.

(21) Appl. No.: 10/688,368

(22) Filed: Oct. 17, 2003

(65) Prior Publication Data

US 2005/0083122 A1 Apr. 21, 2005

(51) Int. Cl.[7] .............................................. H03F 3/217
(52) U.S. Cl. ................................ 330/251; 330/207 A
(58) Field of Search ............................. 330/251, 207 A, 330/10, 295, 124 R (56) References Cited

U.S. PATENT DOCUMENTS

| | | | | |
|---|---|---|---|---|
| 3,239,772 A | * | 3/1966 | Dennis, Jr. ................... | 330/251 |
| 3,394,227 A | * | 7/1968 | Hopengarten et al. ...... | 330/251 |
| 3,854,100 A | * | 12/1974 | Pouzardoux ................. | 330/251 |
| 6,750,711 B2 | * | 6/2004 | Chawla et al. .............. | 330/251 |
| 6,812,785 B2 | * | 11/2004 | Masuda et al. ............... | 330/10 |
| 6,831,508 B2 | * | 12/2004 | Shima ........................... | 330/10 |

* cited by examiner

Primary Examiner—Henry Choe
(74) Attorney, Agent, or Firm—Leonard A. Alkov; Karl A. Vick (57) ABSTRACT

An efficient broadband amplifier. The amplifier includes a mechanism for amplifying an input signal via a high-speed switch and providing an amplified signal in response thereto. Another mechanism filters the amplified signal via common mode rejection and provides an output signal in response thereto. In a specific embodiment, the mechanism for filtering includes a first mechanism for separating an input signal into plural intermediate signals. The mechanism for amplifying includes a second mechanism for amplifying the plural intermediate signals via one or more high-speed switches and providing plural amplified signals in response thereto. The mechanism for filtering further includes a third mechanism for employing common mode rejection to filter the plural amplified signals, yielding a single output signal in response thereto.

23 Claims, 7 Drawing Sheets

EFFICIENT BROADBAND SWITCHING-MODE AMPLIFIER

BACKGROUND OF THE INVENTION

1. Field of Invention

This invention relates to amplifiers. Specifically, the present invention relates to broadband switching-mode amplifiers.

2. Description of the Related Art

High Power Amplifiers (HPA's) are employed in various demanding applications including telecommunications, avionics systems, digital radio transmitters, military targeting and tracking, and transceiver modules for phased array radar systems. Such applications require efficient, lightweight, compact, cost-effective, high power amplifiers. Cost, size, weight, and efficiency considerations are particularly important in space-based transceiver applications, such as space-based phased array radar systems, where any extra size, weight, or HPA inefficiencies can dramatically increase overall mission cost.

Conventional amplifiers are often either Class A, B, A-B, or C amplifiers that operate at a Power Added Efficiencies (PAE's) of less than 50% at X-band, which is the frequency band between 8 and 12 GHz. Internal power dissipation due to overlapping voltage and current waveforms at the amplifier's active device terminals and inefficiencies in output matching network baluns often limit PAE to below 50%, which is undesirably low for various applications, such as space-based radar.

These conventional amplifiers often employ complex microwave baluns that have limited bandwidth and high insertion loss at X-band and that are difficult to integrate with accompanying chipsets. Attempts to improve HPA efficiency and applicability via GaAs Monolithic Microwave Integrated Circuit (MMIC) technology have produced limited results. Generally, wideband amplifiers trade bandwidth for relatively high insertion loss and lower PAE. Currently, highly efficient microwave power amplifiers that operate at PAE's above 60% at frequencies over 2 GHz are unavailable.

Hence, a need exists in the art for a highly efficient, compact, and cost-effective, wideband monolithic HPA capable of operating at RF, X-band, and/or S-band that is easily integrated with various chipsets, including GaAs-based integrated circuits.

SUMMARY OF THE INVENTION

The need in the art is addressed by the efficient broadband amplifier of the present invention. The amplifier includes a mechanism for amplifying an input signal via a high-speed switch and providing an amplified signal in response thereto. An additional mechanism filters the amplified signal via common mode rejection and provides an output signal in response thereto.

In a more specific embodiment, the mechanism for filtering includes a first mechanism for separating an input signal into plural intermediate signals. The mechanism for amplifying includes second mechanism for amplifying the plural intermediate signals via one or more high-speed switches and providing plural amplified signals in response thereto. The mechanism for filtering further includes a third mechanism for employing common mode rejection to filter the plural amplified signals, yielding a single output signal in response thereto.

In the specific embodiment, the first mechanism includes a broadband input balun that receives the input signal and provides a first intermediate signal and a second intermediate signal as output in response thereto. The high-speed input balun imparts approximately 180 degrees of relative signal phase rotation between the first intermediate signal and the second intermediate signal so that the intermediate signals are approximately 180 degrees out of phase.

The second mechanism includes a first high-speed transistor and a second high-speed transistor coupled to the first intermediate signal and the second intermediate signal, respectively. The first high-speed transistor and the second high-speed transistor output a first intermediate amplified signal and a second intermediate amplified signal, respectively. The high-speed transistors include one or more Metal Semiconductor Field Effect Transistors (MESFET's) and/or one or more Pseudomorphic High Electron Mobility Transistors (pHEMPT's).

The third mechanism includes a broadband output balun that combines the first and second intermediate amplified signals into one output signal lacking common mode components, i.e., signal components common to the first intermediate signal and the second intermediate signal. The broadband output balun and the broadband input balun are a slotline baluns. Each slotline balun includes a single coplanar waveguide followed by a transition to a slotline waveguide having a slotline T-junction that separates the slotline into two slotline legs, each slotline leg transitioning to two corresponding coplanar waveguides.

In the illustrative embodiment, the amplifier further includes an output-matching network with one or more tunable capacitors. A controller communicates with one or more of the tunable capacitors and runs an algorithm to optimize amplifier bandwidth. The one or more tunable capacitors include one or more Barium Strontium Titanate (BST) tunable capacitors.

In the illustrative embodiment, the amplifier is adapted for use with other microwave circuits, such as integrated receiver circuits employed in space-based radar transceiver applications. The novel design of the present invention is facilitated by the use of a high speed transistor switch, which may include one or more pHEMPT transistors, to facilitate amplifier switching-mode operation, and the unique, high-performance input and output slotline baluns that facilitate filtering via common mode rejection. The synergistic combination of the slotline baluns with the high-speed switch enable ultra compact HPA's with unprecedented performance.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
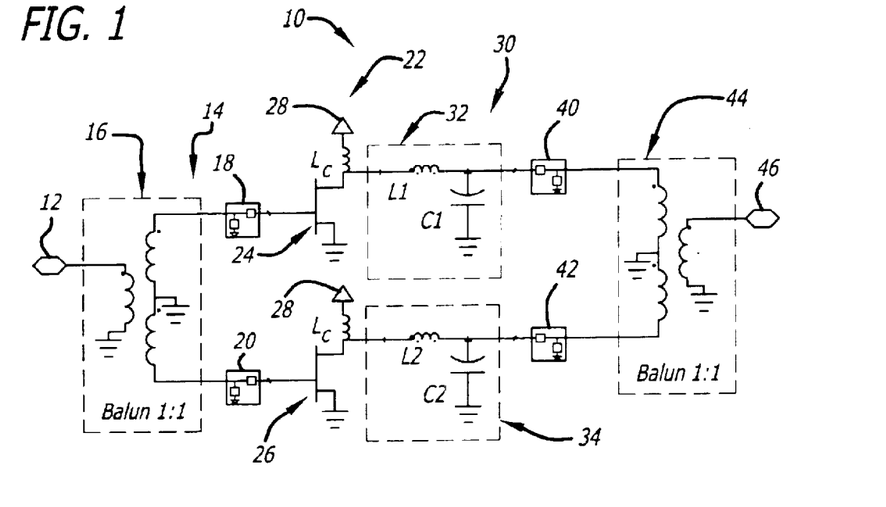
FIG. 1 is a diagram of an efficient broadband switching-mode amplifier constructed in accordance with the teachings of the present invention.

FIG. 1 is a diagram of an efficient broadband switching-mode amplifier 10 constructed in accordance with the teachings of the present invention. For clarity, various features, such as transistor doping profiles, W/L ratios, class-E driver circuits, and so on, have been omitted from the figures. However, those skilled in the art with access to the present teachings will know which features to implement and how to implement them to meet the needs of a given application.

The efficient broadband switching-mode amplifier 10 includes an input signal source 12, such as a microwave X-band or S-band pulsed source that feeds an input circuit 14. The input circuit 14 includes a broadband input slotline balun 16, a first input matching network 18, and a second input matching network 20. The input slotline balun 16 is connected to and receives input from the signal source 12. The input slotline balun 16 provides a first signal output and a second signal output on separate channels, which are 180 degrees out of phase, to the first input matching network 18 and the second input matching network 20, respectively.

The switching-mode amplifier 10 includes a high-speed switching section 22, which includes a first high-speed transistor 24 and a second high-speed transistor 26. The output of the first input matching network 18 is connected to the gate of the first high-speed transistor 24. Similarly, the gate of the second high-speed transistor 26 is connected to the output of the second input matching network 20. In one embodiment, the high-speed transistors 14, 26 are Metal Semiconductor Field Effect Transistors (MESFET's), Pseudomorphic High Electron Mobility Transistors (pHEMPT's), or a combination thereof.

The drains of the high-speed transistors 14, 26 are connected to a Direct Current (DC) source 28 through an RF choke $L_c$. The DC source 28 provides an application-specific voltage to facilitate signal amplification. The exact characteristics of the DC source 28 may be determined by one skilled in the art to meet the needs of a given application, without undue experimentation.

The sources of the high-speed transistors 14, 26 are grounded. In the present specific embodiment, the high-speed transistors 14, 26 are n-channel devices. In applications involving p-channel devices, the sources and drains are reversed such that the drains are grounded, and the sources are connected to the DC source 28.

The drains of the high-speed transistors 14, 26 feed a first LC class-E load 32 and a second LC class-E load 34, respectively, of an output circuit 30. The output circuit 30 also includes a broadband output slotline balun 44, a first output-matching network 40, and a second output-matching network 42. The first output matching network 40 and the second output matching network 42 receive input from the first class-E load 32 and the second class-E load 34, respectively, and provide output to the output slotline balun 44. The output slotline balun 44 combines dual input channels, rejects common modes therebetween, and provides an amplified output signal at the output contact pad 46.

For the purposes of the present discussion, a broadband circuit or circuit component is one that exhibits suitable performance over a wide bandwidth from several megahertz to several gigahertz, such as between 500 MHz–12 GHz. Suitable performance is any performance that is acceptable for a given application. The amplifier 10, transistors 24, 26, and baluns 16 and 44 exhibit broadband performance and efficiently accommodate several input waveforms including pulsed, trapezoidal, and sinusoidal waveforms.

In operation, the input signal source 12 provides a high frequency signal, such as a microwave S-band or X band signal, to the input slotline balun 16. The input slotline balun 16 separates the input signal into two differential signals, also called anti-phase signals, which are 180 degrees out of phase. One differential signal drives the first high-speed transistor 24, while the other differential signal drives the second high-speed transistor 24.

For the purposes of the present discussion, a balun is any device that converts one or more unbalanced transmission line inputs into one or more balanced transmission line outputs or visa versa. The baluns 16, 44 of the amplifier 10 exhibit frequency-independent anti-phase responses.

Since the signals applied to the gates of the high-speed transistors 24, 26 are differential signals, and the transistors 24, 26 are n-channel devices, the transistors 24, 26 are alternately on and off. Hence, when the first transistor 24 is on, the second transistor 26 is off. The first transistor 24 pulls current from the drain to the source, while the second transistor 26 causes current to be pushed from the DC source 28 to the second class-E load 34. Similarly, when the second transistor 26 is on, the first transistor 24 is off. The second transistor pulls current from the drain to the source, while the first transistor 24 causes current to be pushed from the DC source 28 to the first class-E load 34. Hence, the amplifier 10 is a push-pull amplifier.

The DC source 28 facilitates amplification of pulsed signals input to the switching section 22, which is also called a switch for the purposes of the present discussion. Relatively weak RF signals input to the switching section 22 are amplified and result in relatively strong signals at the outputs (drains) of the switching section 22.

The amplifier 10 is also a switching-mode amplifier, such that little or no overlap occurs between voltage and current waveforms at the terminals of the transistors 24, 26, which is discussed more fully below. In the switching section 22, current through the transistors 24, 26 shuts off before voltage across the transistors 24, 26 increases. This reduces leakage and signal power loss in the amplifier 10.

The first class E load 32 is an LC circuit having a first inductor L1 that is connected at one end to the drain of the first transistor 24 and at the other end to a first end of a first capacitor C1 and to an input of the first load-matching network 40. A second end of the first capacitor C1 is grounded. The second class-E load 34 is similar to the first class-E load and has a second inductor L2 and a second capacitor C2 that are connected to the output of the second transistor 26 and to the input of the second load-matching network 42.

The inductance values L1 and L2 and the capacitance values C1 and C2 chosen for the class-E loads 32, 34 affect the output response or frequency response of the amplifier 10. These values L1, L2, C1, and C2 may be chosen by one skilled in the art to meet the needs of a given application and to achieve a desired bandwidth, without undue experimentation.

The output load-matching networks 40, 42 alternately receive input signals from the corresponding class-E loads 32, 34. The output load-matching networks 40, 42 and the input load-matching networks 18, 20 may be constructed from passive low-loss lumped or distributed circuits designed to facilitate input and output load matching for maximum power transfer from input to output. Load-matching circuits are known in the art. Those skilled in the art with access to the present teachings may readily construct appropriate load-matching circuits to meet the needs of a given application. Furthermore, those skilled in the art may employ time domain analysis, harmonic balance analysis, and large signal stability analysis to determine appropriate amplifier component values, such as transmission line, inductance, capacitance, and transistor w/L values.

The output load-matching networks 40, 42 may also serve to attenuate any energy reflected back from waveguide transitions within the broadband output balun 44. This helps to maximize the performance of the push-pull switching-mode amplifier 10.

The outputs of the load-matching networks 40, 42 represent intermediate differential signals, which are input to the broadband output slotline balun 44. The broadband output slotline balun 44 combines two intermediate differential signals into the single output 46 while rejecting common mode components in the intermediate differential signals. The common mode components are necessarily rejected at a slotline T-junction included in the balun 44, as discussed more fully below. The signal at the output pad 46 is an amplified and filtered version of the signal input to the amplifier via the input signal source 12. The output balun 44 employs common mode rejection to filter the differential input signals, eliminating any undesirable common mode components that could be due to asymmetrical transistor rise and fall times and so on.

The input slotline balun 16 and the output slotline balun 44 may be implemented via similar baluns that are oriented in reverse relative to each other. Alternatively, the input balun 16 may be implemented via a different type of input balun, other than a slotline balun, that provides two differential output signals. Those skilled in the art will appreciate that it is not necessary to use the same type of balun for the output balun 44 as is used for the input balun 16.

However, the broadband high-performance baluns 16, 44 disclosed herein are very compact and particularly suited for use with the wideband amplifier 10. The unique design of the high-performance baluns 16, 44 facilitate chip-level integration, such as integration with GaAs integrated circuits, such as GaAs MMIC's.

Those skilled in the art will appreciate that additional circuitry, such as balun transitions to microstrip, coaxial cable, or other waveguide structures may be employed in the amplifier 10 to meet the needs of a given application, without departing from the scope of the present invention.

The broadband amplifier 10 represents a new class of highly efficient and tunable push-pull switching-mode HPA's. Such efficient HPA's are needed for many defense and commercial applications including Spaced Based Radar (SBR) and digital RF transmitters based on Delta-Sigma DSP-controlled chip sets.

The efficient push-pull HPA 10 has plural advantages over conventional single-ended amplifiers, including ultra broadband performance and significantly more output power. Input power is split and fed in anti-phase to the two pHEMT's 24, 26 through the miniature low-loss slotline balun 16.

Preferably, the amplifier 10 is driven by an ultra-fast class-E gate-driver circuit (not shown). The ultra fast pulsed driver circuit will help minimize power dissipation. Conventional driver circuits often employ pulsed amplifiers or overdriven linear amplifiers that are based on bipolar or field effect transistor technologies. These devices provide near-square waveforms or trapezoidal waveforms to the input of the Class-E amplifier 10.

Alternatively, Resonant Tunnel Diodes (RTD's) may be employed to facilitate class-E driver circuit operation. RTD's are fast diodes that exploit quantum mechanical electron and/or hole tunneling through nanometer-thick materials for switching, oscillation, and detection to 1000 GHz. The RTD has plural advantages over conventional negative resistance diodes, including faster switching time, lower voltage operation, improved temperature stability, and enhanced radiation hardness.

With access to the present teachings, one skilled in the art can choose an appropriate driver circuit to meet the needs of a given application. For ultra fast operation, one may integrate RTD's with standard III–V field effect transistors, such as pHEMT transistors, to provide advanced and highly efficient class-E amplifier driver circuits. Such ultra fast drivers, when integrated with the class-E circuitry, will provide a single-chip solution for highly efficient HPA's with extended operating frequency of around 30 GHz.

Figure 2:
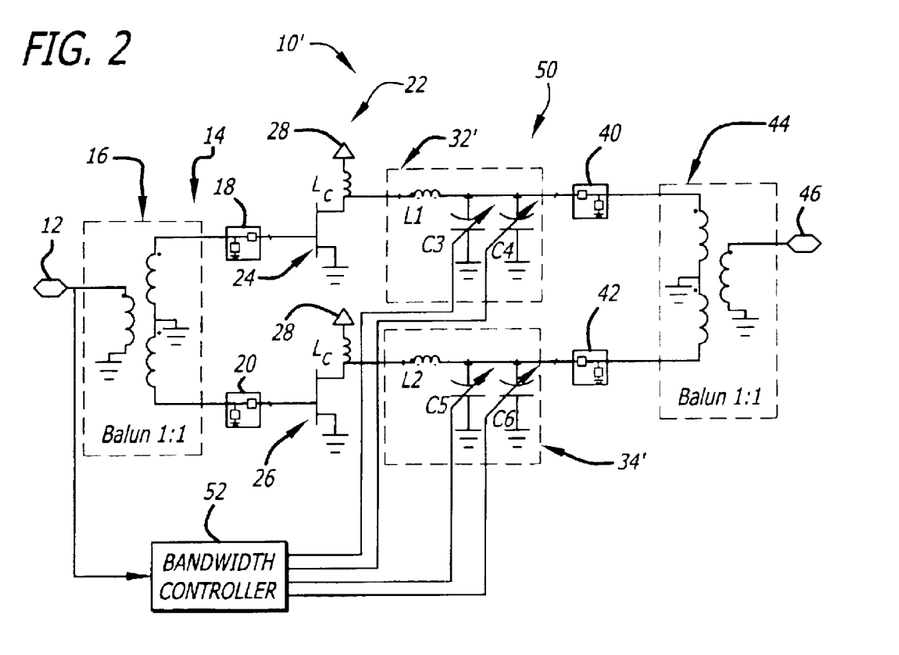
FIG. 2 is a diagram showing an illustrative embodiment of the broadband switching-mode amplifier of FIG. 1 that employs tunable capacitors and a bandwidth controller.

FIG. 2 is a diagram showing an illustrative embodiment 10' of the broadband switching-mode amplifier 10 of FIG. 1 that employs tunable capacitors C3, C4, C5, and C6, and a bandwidth controller 52. The construction and operation of the broadband amplifier 10' of FIG. 2 is similar to the construction and operation of the broadband amplifier 10 of FIG. 1 with the exception that the class-E loads 32 and 34 of FIG. 1 are replaced with the tunable class-E loads 32' and 34' and the bandwidth controller 52.

The first class-E load 32' of FIG. 2 is similar to the class-E load 32 of FIG. 1 with the exception that the first capacitor C1 of FIG. 1 is replaced with the third variable capacitor C3 and the fourth variable capacitor C4, which are in parallel. Similarly, the second class-E load 34' of FIG. 2 is similar to the class-E load 34 of FIG. 1 with the exception that the second capacitor C2 of FIG. 1 is replaced with the fifth tunable capacitor C5 and the sixth tunable capacitor C6, which are in parallel.

The capacitances of the tunable capacitors C3–C6 are voltage-controlled via the bandwidth controller 52, which receives an input signal from the input signal source 12. The bandwidth controller 52 runs a predetermined bandwidth-control algorithm that adjusts the values of the capacitors C3–C6 in response to the frequency or other characteristics of the input signal to achieve a desired amplifier frequency response. Those skilled in the art with access to the present teachings may readily develop and implement an appropriate algorithm to adjust the outputs of the bandwidth controller 52 in response to input signal characteristics to adjust the frequency response of the amplifier 10 to meet the needs of a given application. In an alternative embodiment, the bandwidth controller 52 may provide capacitance control signals that are independent of signal input via the input signal source 12. Hence, the thin-film BST tunable capacitors C3–C6 facilitate tuning the output circuit 30 of the amplifier 10 for operation over a broad bandwidth.

Various commercially available circuit simulation packages may be employed to determine ideal capacitance values for particular input signals to meet the needs of a given application. In the present specific embodiment, the tunable capacitors are thin film Barium Strontium Titanate (BST) tunable capacitors. These capacitors may be obtained through the Raytheon Infrared Operations (RIO) department. Alternatively, one skilled in the art may manufacture such tunable capacitors from high-quality BST using spin-on Metal Organic Decomposition (MOD) processes. Exemplary BST capacitor behavior as a function of control voltage is discussed more fully below.

Figure 3:
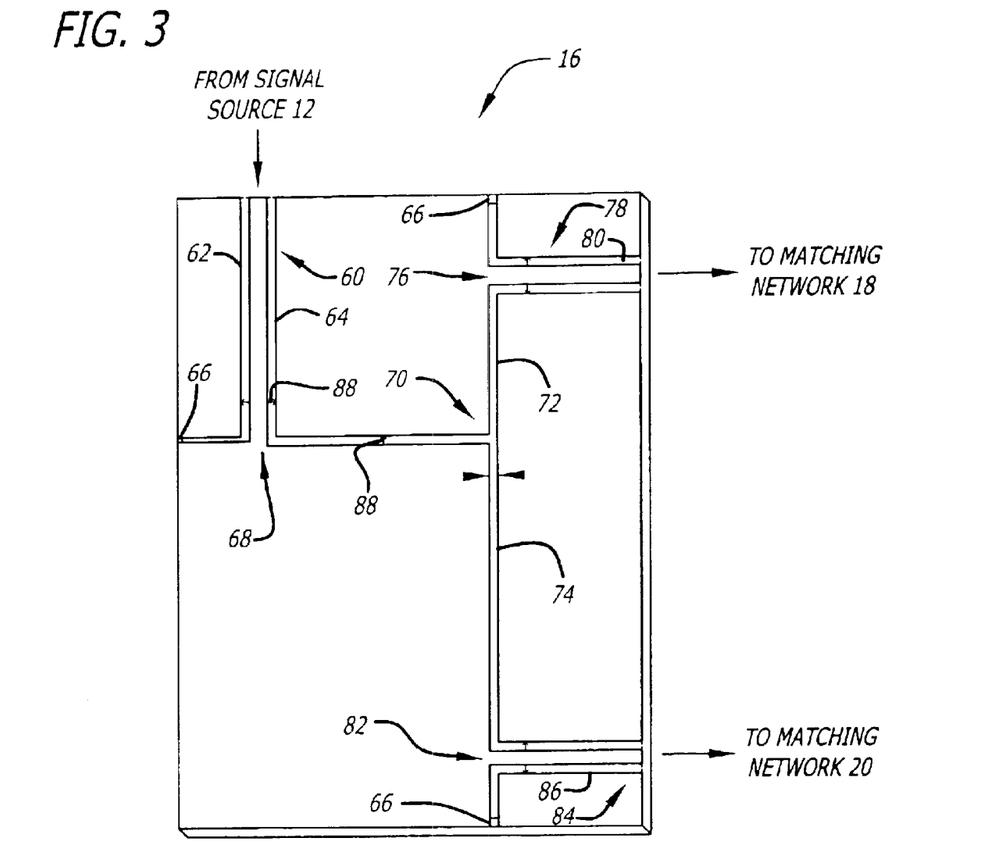
FIG. 3 is a diagram of a unique broadband slotline balun adapted for use with the broadband switching-mode amplifiers of FIGS. 1 and 2.

FIG. 3 is a diagram of a unique broadband slotline balun 16 adapted for use with the broadband switching-mode amplifiers 10 and 10' of FIGS. 1 and 2, respectively. The slotline balun 16 includes an input Coplanar Waveguide (CPW) section 60 having a first input slotline leg 62 and a second parallel input slotline leg 64 extending from a top edge of the slotline balun 16. The input CPW 60 transitions at a first CPW-to-slotline transition 68 to a slotline corresponding to the second input slotline leg 64. The first input slotline leg 62 transitions, at the first CPW-to-slotline transition 68 to a slotline that is terminated via a first open-circuit terminator 66 at the right edge of the slotline balun 16.

The second input slotline leg 64 extends from the first CPW-to-slotline transition 68 to a slotline T-junction 70. At the slotline T-junction 70, the second input slotline leg 64 branches into a third slotline portion 72 above the T-junction 70 and a fourth slotline portion 74 below the T-junction 70.

The third slotline portion 72 becomes part of an upper CPW 78 at a first slotline-to-CPW transition 76. An upper slotline leg 80 forms an upper portion of the upper CPW 78, which extends to the right edge of the slotline balun 16, where it provides output to the first load-matching network 18 of FIGS. 1 and 2. Another portion of the upper slotline leg 80 extends from the first slotline-to-CPW transition 76 to the top edge of the slotline balun 16, where it is open-circuit terminated.

Similarly, the fourth slotline portion 74 extending downward from the slotline T-junction 70 becomes part of a lower CPW 84 at a second slotline-to-CPW transition 82. A lower slotline leg 86 forms part of a lower portion of the lower CPW 84, which extends to the right edge of the slotline balun 16, where it provides output to the second load-matching network 20 of FIGS. 1 and 2. Another portion of the lower slotline leg 86 extends from the second slotline-to-CPW transition 82 to the bottom edge of the slotline balun 16, where it is open-circuit terminated.

In operation, with reference to FIG. 2, the balun receives an input signal from the input signal source 12 of FIG. 1 and provides two differential outputs that are 180 degrees out of phase to the first load-matching network 18 and the second load-matching network 20 via the CPW's 78 and 84, respectively. Additional waveguide transitions, such as microstrip-to-CPW and CPW-to-microstrip transitions (not shown) may be readily employed by those skilled in the art to facilitate interfacing the slotline balun 16 to signal sources and output matching networks.

The input signal, which may be an unbalanced signal, travelling along the input CPW 60 transitions to a balanced signal at the first CPW-to-slotline transition 68. The resulting balanced signal is separated into an upward travelling signal along the third slotline portion 72 and a downward travelling signal along the fourth slotline portion 74, both signals being anti-phase signals. The anti-phase signals then transition to the upper CPW 78 and the lower CPW 84 to facilitate connection to the corresponding load-matching networks 18, 20. Use of the slotline T-junction 70 ensures that signals travelling from the second input slotline leg 64 to the slotline portions 72 and 74 after the T-junction 70 are 180 degrees out of phase, meaning that 180 degrees of relative phase rotation exists between signals travelling on the slotline portions 72 and 74.

In the present specific embodiment, the balun 16 is formed from gold conductor deposited on a dielectric substrate, such as alumina, and etched to form the appropriate CPW and slotline waveguides. Other types of conductors and dielectrics may be employed without departing from the scope of the present invention.

The slotline balun 16 is superior to conventional baluns. In particular, the balun 16 is extremely compact and exhibits excellent broadband performance. The balun designer may adjust the widths of the slotlines 62, 64, 72, 74, 80, 86 to achieve a desired balun performance. However, the balun performance in virtually independent of slotline lengths. Consequently, extremely compact baluns are achievable. The broadband performance and compact size of the balun 16 improves balun applicability and facilitates integration with integrated circuits, such as GaAs integrated circuits and accompanying chipsets.

With reference to FIGS. 1, 2, and 3, the balun 16 may be operated in reverse and used as the output balun 44 of FIGS. 1 and 2. When operated in reverse, the balun 16 converts two differential input signals input to the CPW's 78 and 84 to an output signal on the CPW 60. Any common mode components existing on the input differential signals cancel at the T-junction 70.

Conventionally, wire-wound ferrite baluns are often employed to convert differential input lines into a single balanced output transmission line or vice versa. These baluns have iron cores wrapped in wire and act as power transformers. Unfortunately, ferrite baluns are bandlimited at lower frequencies, typically cutting off frequencies beyond two or three gigahertz, which is undesirably low for many broadband applications, such as space-based radar applications. Furthermore, ferrite baluns are more suitable for continuous wave applications and less suitable for pulse applications, as ferrite baluns are often susceptible to reflections resulting from fast input pulses. To improve balun transient response, the baluns are made larger. The large ferrite baluns are difficult to incorporate into miniature integrated circuits and poorly reject common mode energy.

The baluns 16 and 44 exhibit broadband performance and efficiently accommodate pulsed waveforms. The broadband high-performance baluns 16, 44 disclosed herein are very compact and particularly suited for use with the wideband amplifier 10. Furthermore, unlike conventional baluns, the unique design of the high-performance baluns 16, 44 facilitate chip-level integration.

The baluns 16 and 44 are unique, low-loss slotline baluns capable of insertion losses of less than 1 dB at X-band and <0.5 dB at S-band. The baluns 16 and 44 are called slotline baluns due to the slotline T-junction 70 and the fact that coplanar waveguides incorporate parallel slotlines.

The novel baluns 16 and 44 eliminates the usage of an ordinary 180-degree hybrid balun for power splitting and combining purposes, thereby reducing the associated power loss. The miniature baluns 16 and 44 have demostrtated ultra broad bandwidth performace from DC to 10.0 GHz and have been optimized for minimum loss of 0.5 dB across the 2–6 GHz frequency band. Several slotline baluns were designed, fabricated, and measured to demonstrate the usefulness of the balun 16. These miniature broadband baluns are simple to fabricate and easy to integrate with SiGe or GaAs technologies. An exemplary orientation of electric fields 88 in these slotline baluns are shown in FIG. 3.

Alternative baluns that may be employed to implement an embodiment of the present invention are disclosed in co-pending U.S. patent application Ser. No. 10/425,263 filed Apr. 29, 2003, entitled COMPACT BROADBAND BALUN, assigned to the assignee of the present invention and incorporated herein by reference.

Figure 4:
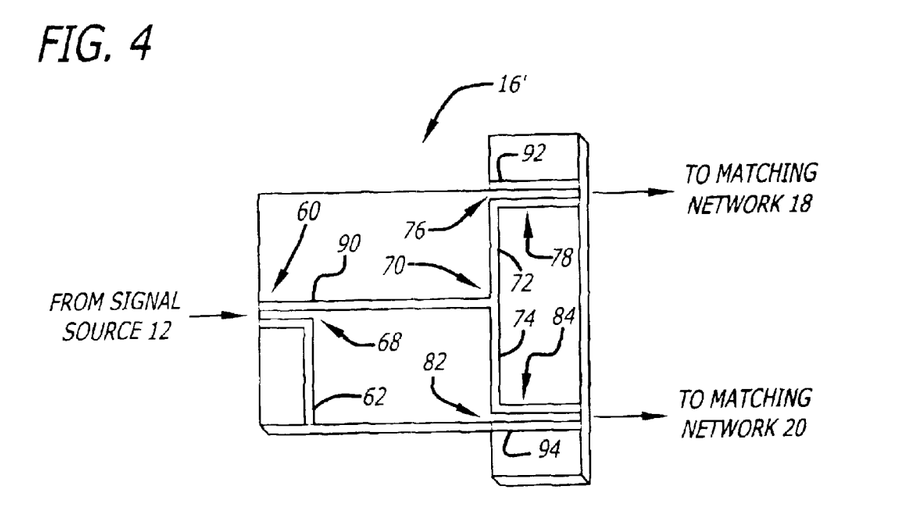
FIG. 4 is a diagram of a first alternative embodiment of the balun of FIG. 3.

FIG. 4 is a diagram of a first alternative embodiment 16' of the balun of FIG. 3. The operation of the alternative balun 16' is similar to the operation of the balun 16 of FIG. 3. However, the input CPW 60 of FIG. 4 extends from the left edge of the balun 16' instead of from the top edge. Furthermore, an upper slotline leg 92 of the upper CPW 78 terminates at an open end at the first slotline-to-CPW transition 76. In addition, a lower slotline leg 94 of the lower CPW 84 terminates at an open end at the second slotline-to-CPW transition 82. Consequently, the overall shape of the slotline balun 16' is T-shaped instead of square. The T-shape may reduce the footprint of the slotline balun 16', thereby enhancing space-efficiency.

The slotline legs 92 and 94 terminate at corners. Consequently, open-circuit terminators 66 of FIG. 3 are not required. V-shapes are known to provide effective open-circuit termination.

Figure 5:
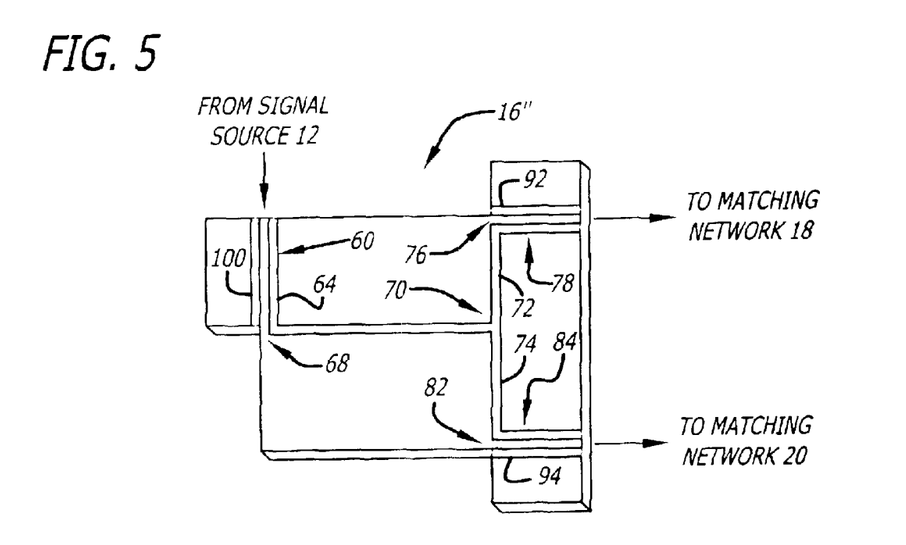
FIG. 5 is a diagram of a second alternative embodiment of the balun of FIG. 3.

FIG. 5 is a diagram of a second alternative 16" embodiment of the balun 16 of FIG. 3. The construction and operation of the second alternative balun 16" is similar to the construction and operation of the alternative balun 16' of FIG. 4 with the exception that the input CPW 60 has a left slotline leg 100 that is terminated at the CPW-to-slotline transition 68. The termination occurs at a corner, facilitating open-circuit termination. The balun 16" may have a reduced footprint over those of FIGS. 3 and 4.

Figure 6:
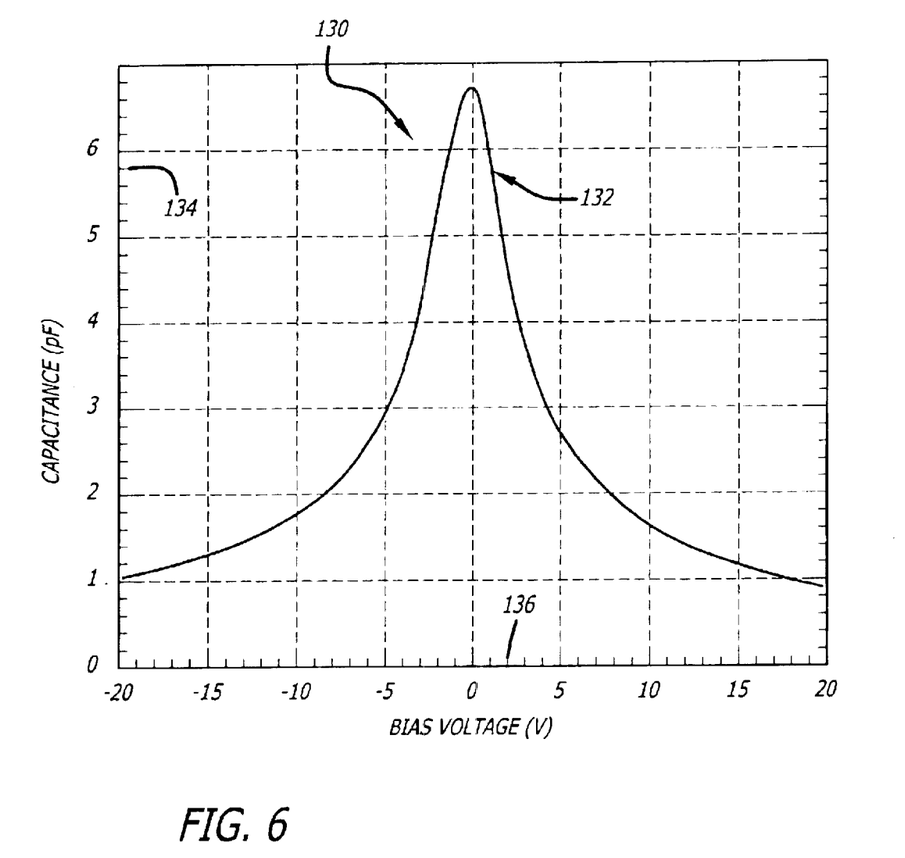
FIG. 6 is a graph illustrating capacitance versus bias voltage for the tunable capacitors of FIG. 2.

FIG. 6 is a capacitance graph 130 illustrating capacitance 134 versus bias voltage 136 for the tunable capacitors C3–C6 of FIG. 2. A capacitance plot 132 shows how capacitance of the capacitors C3–C6 changes as a function of bias voltage provides by the bandwidth controller 52 of FIG. 2. The capacitance of the capacitors C3–C6 may be adjusted by more than a factor of 5.0 by application of bias voltage. To meet the needs of different applications, those skilled in the art will appreciate that different capacitance tunable ranges may be obtained by employing capacitance networks comprising tunable capacitors. The overall capacitance of the network may be adjusted by tuning individual capacitors of the network.

The capacitance plot 132 is for a Metal-Insulator-Metal (MIM) BST varactor, with a 160.0 nanometer thickness and an active area of 20.0×100.0 microns. The capacitance density is approximately 32 fF/um$^2$ (dielectric constant of ~580), which is nearly a factor of 100 larger than a typical SiN capacitor. The measured tunable range is over 6:1 in the 0–20V DC range plotted.

Quality factors (Q) of over 100 at 30 MHz for such BST capacitors are common. Raytheon Company has also fabricated various tunable plate capacitors with values ranging from 15 pF to 2200 pF. These devices have been tested at frequencies up to 1.0 GHz. Other types of capacitor structures such as co-planar and interdigitated designs can be fabricated using this process. Such structures would be appropriate for microwave applications, such as the amplifier 10' of FIG. 2. Other types of tunable capacitors, such as GaAs varactors and Micro Electromechanical Systems (MEMS) tunable capacitors, may be employed to implement an embodiment of the present invention without departing from the scope thereof.

Figure 7:
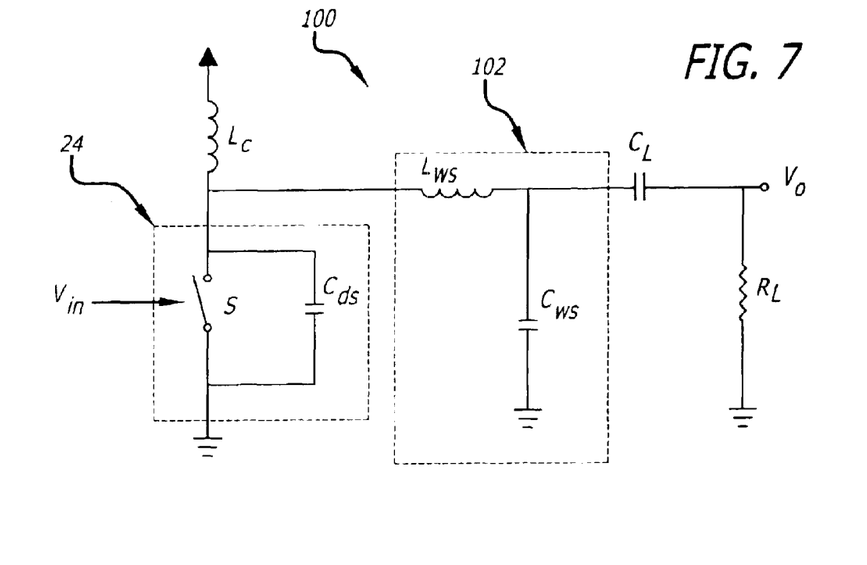
FIG. 7 is diagram illustrating an equivalent circuit of a basic switching-mode amplifier constructed in accordance with the teachings of the present invention.

FIG. 7 is diagram illustrating an equivalent circuit of a basic switching-mode amplifier 100 constructed in accordance with the teachings of the present invention. The basic switching-mode amplifier 100 includes the pHEMPT transistor 24, which is modeled as a switch (S) and a drain-to-source capacitance ($C_{ds}$). The drain of the pHEMPT 24 is connected to a voltage source (V) through the RF choke Lc in a bias line. The drain of the pHEMPT is also connected to a first end of a wave-shaping inductor ($L_{ws}$) in a wave-shaping network 102. A second end of the wave-shaping inductor $L_{ws}$ is connected to a first end of a wave-shaping capacitor ($C_{ws}$) in the wave-shaping network 102 and to a first end of a series capacitance ($C_s$). The second end of the wave-shaping capacitor $C_{ws}$ is grounded. The second end of the series capacitance $C_s$ is connected to one end of a load resistor ($R_L$). A second end of the load resistor $R_L$ is grounded. The switch S and capacitor $C_{ds}$ represent the active device 24, which is pHEMT switching device in the present embodiment. $L_{ws}$ and $C_{ws}$ implement the wave-shaping network 102; the series capacitance $C_s$ is a dc blocking cap; and $R_L$ represents the output load. In operation, the amplifier 100 amplifies an input voltage ($V_{in}$) and provides an output voltage ($V_o$) in response thereto.

Figure 8:
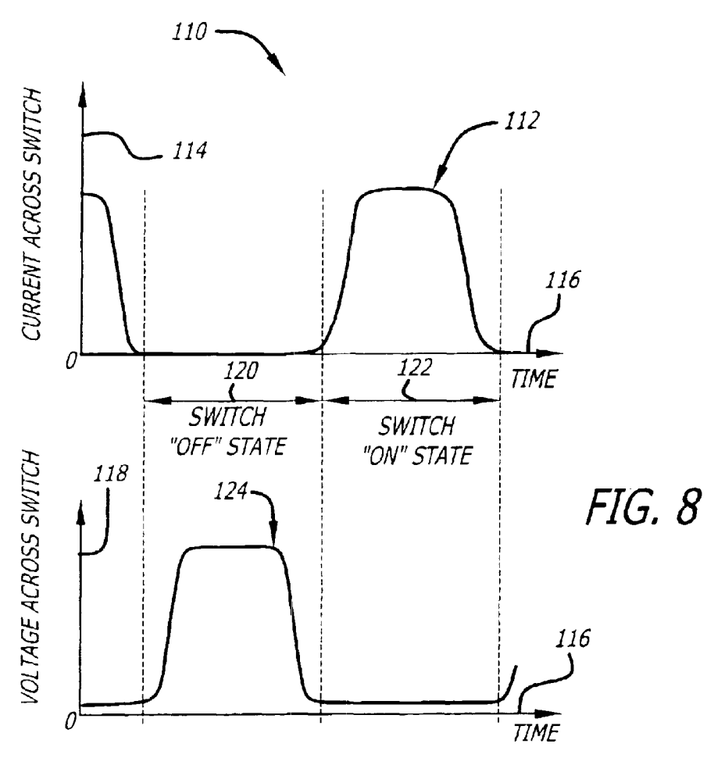
FIG. 8 is a diagram illustrating ideal terminal voltage and current waveforms associated with the switching transistors of FIGS. 1–2 and FIG. 7.

FIG. 8 is a graph 110 illustrating ideal terminal voltage 124 and current 112 waveforms associated with the switching transistors 24, 26 of FIGS. 1–2 and FIG. 7. The graph 110 illustrates ideal switching-mode operation of the switching transistors 24, 26 of the broadband switching-mode amplifiers 10, 10' of FIGS. 1 and 2 and FIG. 7.

The switching-mode graph 110 juxtaposes a current plot 112 plotted as a function of current 114 across one of the transistors 24, 26 versus time 116, and a voltage plot 124 plotted as a function of voltage 118 across one of the transistors 24, 26 versus time 116. The transistor current plot 112 represents drain-to-source current, often called $I_{DS}$. The transistor voltage plot 124 represents drain-to-source voltage, often called $V_{DS}$.

The switching-mode graph 110 illustrates that little or no overlap occurs between voltage 124 and current 112 waveforms in a switching-mode amplifier constructed in accordance with the teachings of the present invention. With reference to the current plot 112, the current through one of the transistors 24, 26, shuts off before the voltage across the transistor builds, as shown in the voltage plot 124. When the voltage reaches a maximum, the current reaches a minimum, which is approximately no current. The transistors 24, 26 of FIGS. 1 and 2 are high-speed low-leakage transistors. Little or no current ($I_{DS}$) leaks from the transistor drains to sources when the voltage ($V_{DS}$) across the transistors begins to build.

Under ideal conditions, switching-mode amplifiers operate as perfect switches with no overlapping voltage and current waveforms at the device terminals, thereby dissipating little or no power. Other classes of amplifiers often operate as a current-source with overlapping voltage and current waveforms and hence lower efficiency. Amplifiers constructed in accordance with the teachings of the present invention may operate in the switching mode with PAE's>90% at S-band and 70% at X-band.

Figure 9:
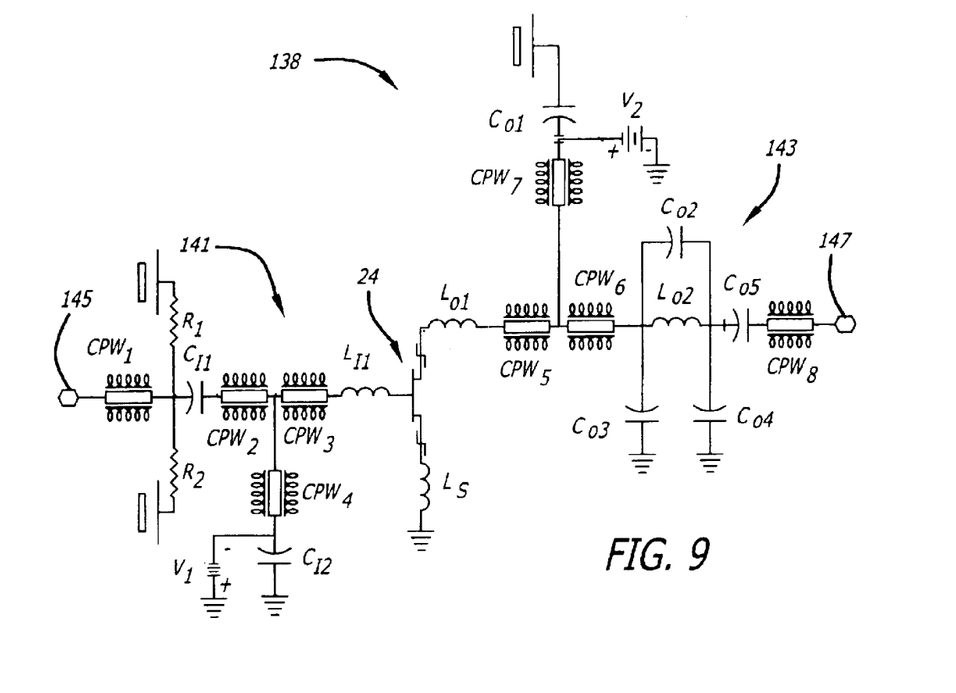
FIG. 9 is a diagram illustrating an equivalent circuit of a switching-mode S-band amplifier constructed in accordance with the teachings of the present invention.

FIG. 9 is a diagram illustrating an equivalent circuit of a switching-mode S-band amplifier 138 constructed in accordance with the teachings of the present invention. The switching-mode S-band amplifier 138 includes an input network 141, the intervening pHEMPT transistor 24, and an output network 143. The input network 141 includes various components, such as an input terminal 145, various coplanar waveguides ($CPW_1$–$CPW_4$), input capacitors ($C_{I1}$–$C_{I2}$), resistors ($R_1$, $R_2$), and an input inductor ($L_{I1}$), and a voltage source ($V_1$).

The input network 141 is connected to the gate of the pHEMPT transistor 24 at one end of the input inductor $L_{I1}$. The source of the pHEMPT transistor 24 is connected to one end of a source inductor ($L_s$), which is connected to ground. The pHEMPT transistor 24 is connected to the output network 143 at a first output inductor ($L_{O1}$). The output network 143 includes various components, such as an output terminal 147, coplanar waveguides ($CPW_5$–$CPW_8$), output capacitors ($C_{O1}$–$C_{O5}$), inductors ($L_{O1}$, $L_{O2}$). The exact component values may be determined by one skilled in the art to meet the needs of a given application.

The switching-mode S-band amplifier 138 illustrates an exemplary circuit schematic of a single-ended switching-mode S-band amplifier constructed in accordance with the teachings of the present invention. The performance of amplifier 138 is discussed below.

Figure 10:
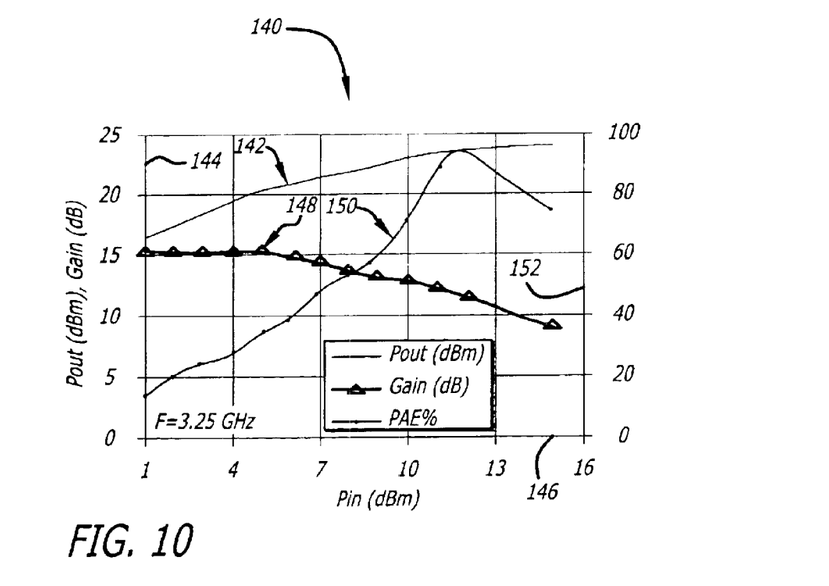
FIG. 10 is a graph illustrating the record performance of a switching-mode S-band amplifier constructed in accordance with FIG. 9.

FIG. 10 is a graph 140 illustrating the record performance of the switching-mode S-band amplifier of FIG. 9 constructed in accordance with the teachings of the present invention. The S-band performance graph 140 includes a vertical output power/gain axis 144 that has units of (10 log ((Power in milliwatts)/(1 milliwatt))=dBm) for an output-power plot 142 and units of gain for a gain plot 148. The performance graph 140 includes a horizontal input power axis 146 having units of dBm. A right vertical Power Added Efficiency (PAE) axis 152 has units of percentage.

The S-band performance graph 140 includes the output power plot 142, the gain plot 148, and a PAE plot 150, which were all measured at 3.25 GHz. With an input power between 10.0 and 13.0 dBm, a record PAE of over 90% is achieved along with a peak output power of over 23.0 dBm. The gain 148 drops off only marginally with increasing input power 146. The amplifier that produced the results shown in FIG. 8 was an S-band monolithic CPW class-E amplifier employing a 0.3 μm×1000.0 μm pHEMT switch.

Figure 11:
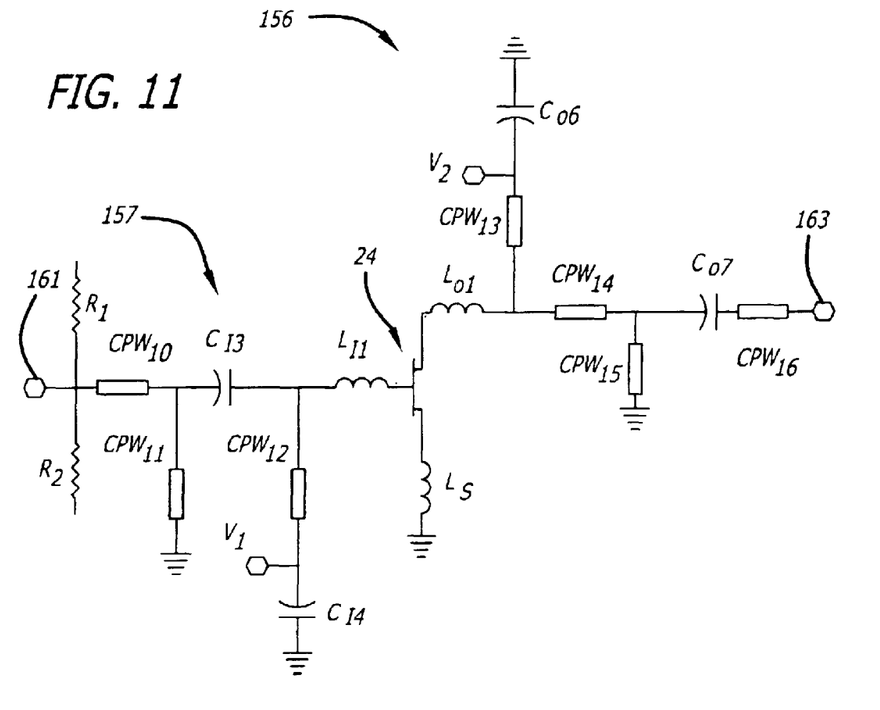
FIG. 11 is a diagram illustrating an equivalent circuit of a switching-mode X-band amplifier constructed in accordance with the teachings of the present invention.

FIG. 11 is a diagram illustrating an equivalent circuit of a switching-mode X-band amplifier 156 constructed in accordance with the teachings of the present invention. The switching-mode X-band amplifier 156 includes an input X-band network 157 having an input terminal 161 and an output network 159 having an output terminal 163. The networks 157 and 159 are interconnected by the pHEMPT transistor 24. The switching-mode X-band amplifier 156 represents an exemplary circuit schematic for an X-band single ended switching mode amplifier.

Figure 12:
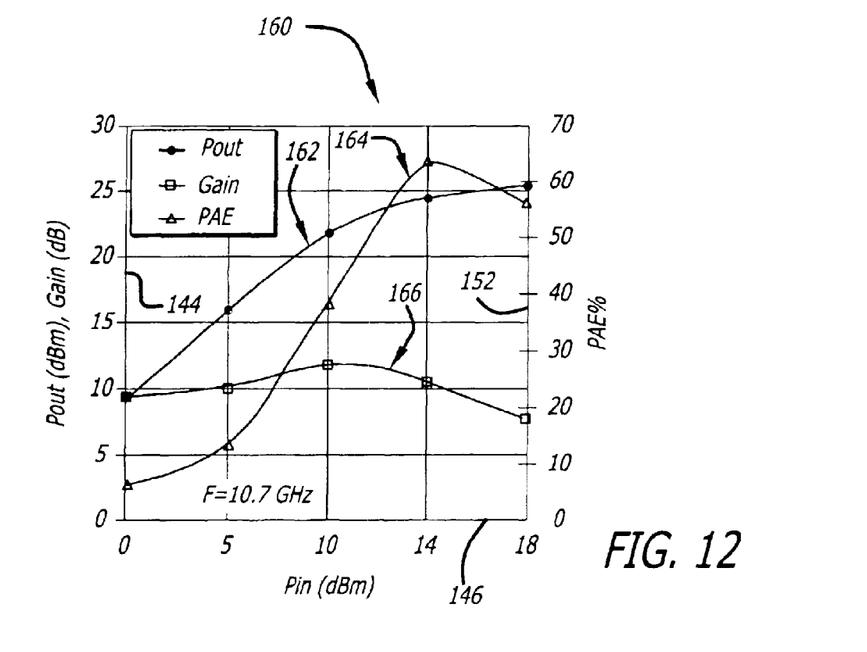
FIG. 12 is a graph illustrating the record performance of a switching-mode X-band amplifier constructed in accordance FIG. 11.

FIG. 12 is a graph 160 illustrating the record performance of a switching-mode X-band amplifier (not shown) constructed in accordance with FIG. 11. The axis 144, 146, 152 of the graph 160 of FIG. 9 are similar the axis 144, 146, 152 of FIG. 8. The X-band performance graph 160 includes an X-band output power plot 162, a gain plot 166, and an X-band PAE plot 164. The plots 162–166 were obtained at an input frequency of approximately 10.7 GHz.

The X-band amplifier exhibits a PAE of more than approximately 60% (approximately 63%) at an input power of slightly more than 14.0 dBm. The gain 166 remains effective, and the output power continues to increase beyond 25.0 dBm as the input power 146 increases. The performance also demonstrated a gain of over 10 dB over 9–11 GHz. The efficient performance illustrated in FIG. 9 was obtained from an X-band monolithic class-E amplifier employing a 0.3 μm×600 μm pHEMT transistor switch.

Generally, HPA PAE's at X-band are near 50%. However, this is inadequate for various applications, including SBR applications. The success of prior attempts to improve amplifier PAE and reduce amplifier size has been limited.

Conventional baluns often trade PAE for bandwidth and are often based on current-source amplifiers, such as class A, B, AB, or C amplifiers. These amplifiers typically exhibit overlapping voltage and current waveforms at the device terminals, which increases device power dissipation and decreases amplifier PAE. Furthermore, such amplifiers often employ conventional microwave baluns that are implemented via complex topology circuits, which are often very lossy, especially when realized in GaAs MMIC technology. This further limits the PAE of the accompanying amplifiers.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

Accordingly,
What is claimed is:

1. An efficient amplifier comprising:
   means for amplifying an input signal via a high-speed switch and providing an amplified signal in response thereto and,
   means for filtering said amplified signal via common mode rejection and providing an output signal in response thereto;
   wherein said means for filtering includes first means for separating an input signal into plural intermediate signals, and wherein said means for amplifying includes second means for amplifying said plural intermediate signals via one or more high-speed switches and providing plural amplified signals in response thereto, wherein said means for filtering further includes third means for employing common mode rejection to filter said plural amplified signals, yielding a single output signal in response thereto, and wherein said first means includes a broadband input balun that receives said input signal and provides a first intermediate signal and a second intermediate signal as output in response thereto, said broadband input balun sufficient to impart approximately 180 degrees of relative signal phase rotation between said first intermediate signal and said second intermediate signal so that said intermediate signals are approximately 180 degrees out of phase.

2. The amplifier of claim 1 wherein said second means includes a first high-speed transistor and a second high-speed transistor coupled to said first intermediate signal and said second intermediate signal, respectively, and outputting a first intermediate amplified signal and a second intermediate amplified signal, respectively.

3. The amplifier of claim 2 wherein said first high-speed transistor and said second high-speed transistor include one or more Metal Semiconductor Field Effect Transistors (MESFET's) and/or one or more Pseudomorphic High Electron Mobility Transistors (pHEMPT's).

4. The amplifier of claim 2 wherein said third means includes a broadband output balun, said output balun oriented to combine said first and second intermediate amplified signals into one output signal lacking common mode components common to said first intermediate signal and said second intermediate signal.

5. The amplifier of claim 4 wherein said broadband output balun and/or said broadband input balun include slotline T-junctions.

6. The amplifier of claim 5 wherein said broadband input balun is a slotline balun that includes single coplanar waveguide followed by a transition to a slotline waveguide having a slotline T-junction that separates said slotline waveguide into two slotline legs, each slotline leg transitioning to two corresponding coplanar waveguides.

7. The amplifier of claim 4 further including an output network with one or more tunable capacitors.

8. The amplifier of claim 7 further including a controller in communication with said one or more tunable capacitors, said controller running an algorithm to optimize amplifier bandwidth.

9. The amplifier of claim 8 wherein said one or more tunable capacitors include one or more Barium Strontium Titanate (BST) tunable capacitors.

10. An efficient switching-mode amplifier comprising:
a broadband balun that provides two or more channels from a single input channel; and
a switch connected in series to each of said two or more channels;
wherein said broadband balun is a broadband input balun, and wherein said amplifier further includes an output circuit connected at an output of said switch, said output circuit having a broadband output balun that provides.

11. The amplifier of claim 10 wherein said broadband input balun is a slotline balun that includes an input coplanar waveguide followed by a transition to a slotline waveguide having a slotline T-junction that separates said slotline into two slotline legs, each slotline leg transitioning to corresponding output coplanar waveguides.

12. The amplifier of claim 10 wherein said switch includes one or more high-speed transistors.

13. The amplifier of claim 12 wherein said one or more high-speed transistors include one or more Metal Semiconductor Field Effect Transistors (MESFET's).

14. The amplifier of claim 12 wherein said one or more high-speed transistors include a Pseudomorphic High Electron Mobility Transistor (pHEMPT).

15. The amplifier of claim 14 wherein said amplifier is an S-band Coplanar Waveguide (CPW) push-pull class-E amplifier.

16. The amplifier of claim 15 wherein said pHEMPT is approximately 0.3 $\mu$m by 1000 $\mu$m.

17. The amplifier of claim 14 wherein said amplifier is an X-band monolithic push-pull class-E amplifier.

18. The amplifier of claim 17 wherein said pHEMPT is approximately 0.3 $\mu$m by 600 $\mu$m.

19. The amplifier of claim 14 wherein said amplifier includes one or more tunable circuit components to increase bandwidth of said amplifier.

20. The amplifier of claim 19 wherein said one or more tunable circuit components include a tunable capacitor.

21. The amplifier of claim 20 wherein said tunable capacitor is a Barium Strontium Titanate (BST) tunable capacitor sufficient to tune a load or output matching network of said amplifier for operation over a broad bandwidth between 1 to 20 GHz.

22. The switching-mode amplifier of claim 10 wherein said switching-mode amplifier is a class-E amplifier, and wherein said broadband input balun is a low-loss broadband slotline balun.

23. The amplifier of claim 22 wherein said amplifier is integrated with a GaAs Monolithic Microwave Integrated Circuit (MMIC).

* * * * *

UNITED STATES PATENT AND TRADEMARK OFFICE
CERTIFICATE OF CORRECTION

| | |
|---|---|
| PATENT NO. | : 6,949,978 B2 |
| APPLICATION NO. | : 10/688368 |
| DATED | : September 27, 2005 |
| INVENTOR(S) | : Reza Tayrani et al. |

It is certified that error appears in the above-identified patent and that said Letters Patent is hereby corrected as shown below:

Claim 10, Column 13, line 43, insert between "provides" and "." -- a single output channel from said two or more channels --

Signed and Sealed this
Eleventh Day of September, 2012

David J. Kappos
*Director of the United States Patent and Trademark Office*